United States Patent [19]

Nishiura et al.

[11] 4,456,782
[45] Jun. 26, 1984

[54] SOLAR CELL DEVICE

[75] Inventors: Masaharu Nishiura; Hiroshi Sakai; Masahide Miyagi; Yoshiyuki Uchida; Hiromu Haruki, all of Kanagawa, Japan

[73] Assignee: Fuji Electric Co., Ltd., Kanagawa, Japan

[21] Appl. No.: 420,216

[22] Filed: Sep. 20, 1982

[30] Foreign Application Priority Data

Mar. 20, 1981 [JP] Japan ................................. 56-40762
Mar. 24, 1981 [JP] Japan ................................. 56-42942

[51] Int. Cl.³ .......................................... H01L 31/06
[52] U.S. Cl. .................................... 136/244; 136/258; 136/293
[58] Field of Search ................. 136/244, 258 AM, 293

[56] References Cited

U.S. PATENT DOCUMENTS 4,257,821 3/1981 Kelly .................................... 136/244
4,281,208 7/1981 Kuwano et al. ............. 136/249 MS
4,334,120 6/1982 Yamano et al. .................... 136/248

FOREIGN PATENT DOCUMENTS 56-13777 2/1981 Japan ................................. 136/244
56-13778 2/1981 Japan ................................. 136/244
56-13779 2/1981 Japan ................................. 136/244
56-38872 4/1981 Japan ................................. 136/244
56-69871 6/1981 Japan ................................. 136/244

Primary Examiner—Aaron Weisstuch
Attorney, Agent, or Firm—Sughrue, Mion, Zinn, Macpeak and Seas

[57] ABSTRACT

A solar cell array is equipped with serially or parallel connected reverse polarity diodes formed simultaneously with the array. The diodes are constituted by one or more solar cells of the array which may be shaded to prevent photoelectric conversion, and which are electrically connected in reverse polarity with respect to the remaining cells.

14 Claims, 18 Drawing Figures

FIG. 4
FIG. 5
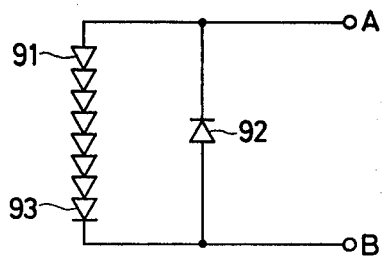
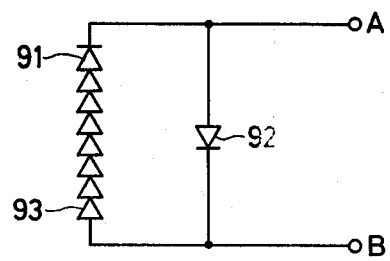
FIG. 4a
FIG. 5a
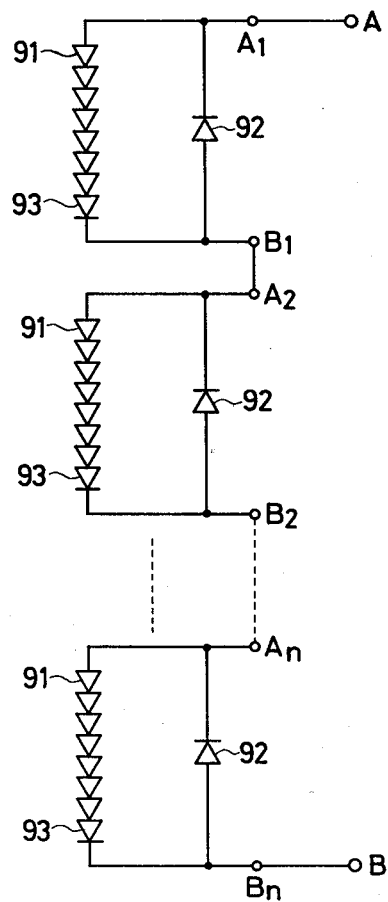
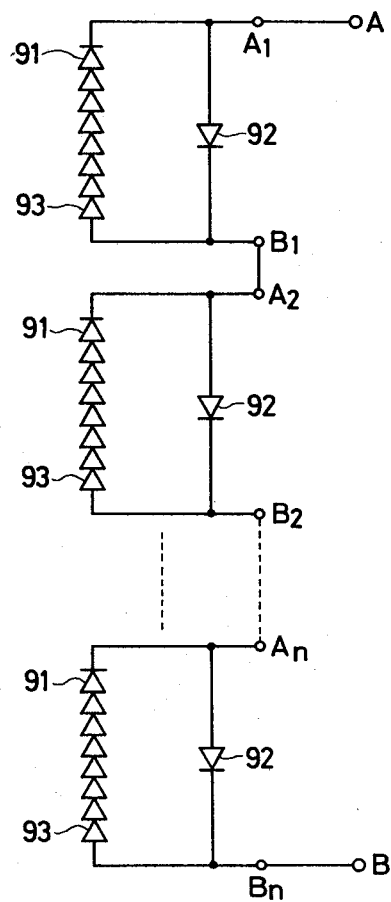

SIMILAR

SOLAR CELL DEVICE

BACKGROUND OF THE INVENTION

This invention relates to a solar cell device which comprises thin film semiconductor solar cells formed on a substrate and connected in series with one another.

Solar cells arranged on a substrate have attracted attention as photoelectric conversion devices for converting sunlight or the light of a lamp into electrical energy. Each of the cells includes a semiconductor thin film, for example silicon, having a pn junction or a Schottky barrier acting as a photoelectric conversion region, and an electrode formed on both surfaces of the semiconductor thin film. However, since the solar cell has a low electromotive force, a plurality of solar cells must be connected in series and in parallel with one another in order to be useful as a power supply. When either one or more of a group of solar cells connected in series are shaded, the desired electromotive force is not generated, and the cells may be reversely biased by the electromotive force of other cells, thereby often destroying such cells. In order to prevent this disadvantage, a diode 2 has been reversely connected in parallel with one solar cell 1 to prevent the reverse bias as shown in FIG. 1, or connected in parallel with several solar cells 1 connected in series to prevent them from destruction due to the reverse bias which may occur even if only one of solar cells 1 is shaded, as shown in FIG. 2. FIGS. 1a and 2a are other examples showing series connections of cell arrangements as shown in FIGS. 1 and 2, respectively. If surge noise caused by a large external disturbance such as a thunderbolt is applied between both terminals of the solar cells connected in series, the probability that the reverse bias is added to the solar cells is made low and the reliability is increased by the diode 2. However, it is necessary for the diode 2 to be separately prepared and connected to the solar cells when the solar cell device is manufactured. Also in the conventional configuration, if an imbalance is generated among the solar cells connected in parallel, a circulating current may flow therethrough to lower the output. If some of the solar cells begin to be particularly deteriorated, the deterioration is promoted by this current, thereby increasing the output reduction. Therefore, a diode having a polarity opposite with respect to the polarity of the juction of the solar cells is connected in series with respective parallel circuits to prevent the circulating reverse current from flowing therethrough. However, again, the diodes must be separately prepared for this purpose and then connected to the circuits, thereby increasing the cost and complicating the manufacturing process. In addition, the solar cell device is inconvenient to handle because the thickness or the area thereof is increased.

SUMMARY OF THE INVENTION

It is an object of the presnt invention to provide a solar cell device eliminating the disadvantages described, which can be produced by a simple fabrication method and can prevent reverse biasing or the circulating reverse current described above.

In the device according to one aspect of the invention, solar cells are formed, each being composed of a first conductive film, a semiconductor film having a junction, and a second conductive film, the solar cells being arranged on a substrate at desired intervals. The first conductive film contacts the substrate, and either the substrate and the first conductive film or the second conductive film is made of a light transmitting material. All of the solar cells are connected in series by respectively connecting the first conductive film of a cell to the second conductive film of an adjacent cell in turn, and the first conductive film of a cell at one end of the series and the second conductive film of another cell at another end of the series are connected to one terminal, the second conductive film of a cell disposed a predetermined number of cells from a predetermined end being connected to another terminal.

In a second construction according to the invention, solar cells are formed, each being composed of a first conductive film, a semiconductor film having a junction, and a second conductive film arranged on a substrate at desired intervals. Either the substrate and the first conductive film or the second conductive film is made of a light transmitting material. In this construction, a pair of adjacent cells share a common first conductive film. A first terminal is connected to one of the two cells at a second conductive film thereof and a second terminal is connected to a second conductive film of a further cell.

BRIEF DESCRIPTION OF THE DRAWINGS

FIGS. 4 and 5 are the equivalent circuits of the FIG. 3 device;

FIGS. 4a and 5a are circuit diagrams showing series connections of FIGS. 4 and 5, respectively;

DETAILED DESCRIPTION OF THE PREFERRED EMBODIMENTS

Figure 3:
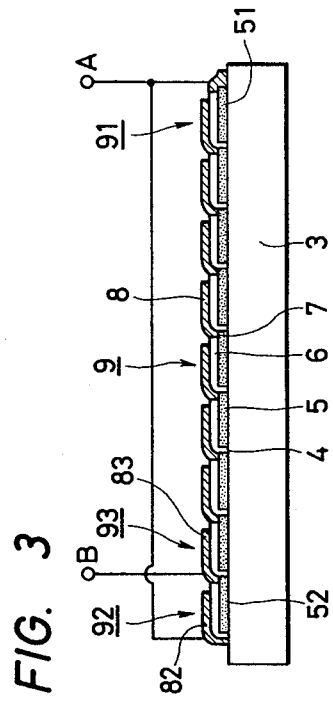
FIG. 3 is a cross-sectional view showing one embodiment of the present invention.

In FIG. 3, a transparent conductive film 5 made of, for example, ITO (Indium Tin Oxide) is formed with small spaces 4 therein on a glass plate 3 serving as a substrate, by means of sputtering techniques. An amorphous silicon film 6, which fills the spaces 4 and covers the transparent conductive film 5 therewith, is provided on the substrate with small spaces 7 therein, by means of a plasma CVD technique, which is carried out, for example, by decomposing monosilane in a glow discharge to deposit the amorphous silicon. A metal film 8 such as a deposited film of aluminum, which fills the spaces 7 and covers the silicon film 6 therewith, is then provided. The amorphous silicon film 6 comprises three layers (not shown) i.e., a p-type layer, an intrinsic layer, and an n-type layer which are successively deposited on the substrate in the stated order. Such a film 6 can be produced by the decomposition of monosilane (SiH4) in a glow discharge, as is well known. Diborane (B2H6) or phosphine (PH3) is added to the monosilane so as to obtain the p-type or n-type layers. When light is applied to the amorphous silicon film through the substrate 3 and the transparent conductive film 5, the photoelectric conversion process of the solar cell is carried out by the p-i-n junction. The respective solar cells 9 are connected in series by the structure shown in FIG. 3.

In this case, the transparent conductive film 51 at one side of end cell 91 and the metal film 82 at the other side of end cell 92 are connected to a common terminal A, and the transparent conductive film 52 of the cell 92, and the metal film 83 of the cell 93 adjacent to the cell 92 are connected to another terminal B. This connection corresponds to the equivalent circuit shown in FIG. 4. That is, one solar cell 92 is connected reversely in parallel with the solar cells 91–93 connected in series.

Figure 1:
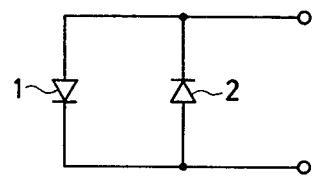
FIGS. 1 and 2 are circuit diagrams showing a solar cell(s) connected to a diode for preventing reverse bias.
Figure 2:
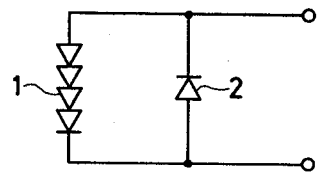
Figure 1A:
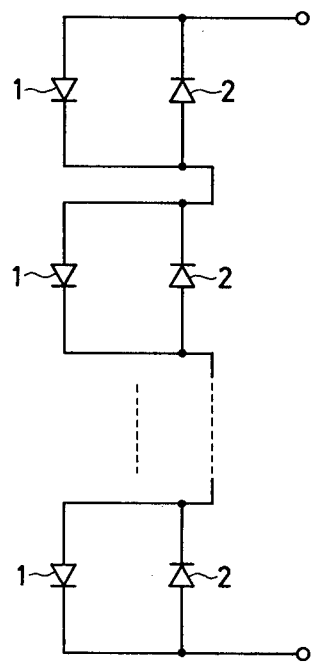
FIGS. 1a and 2a are other examples showing series connections of cell arrangements of FIGS. 1 and 2, respectively.
Figure 2A:
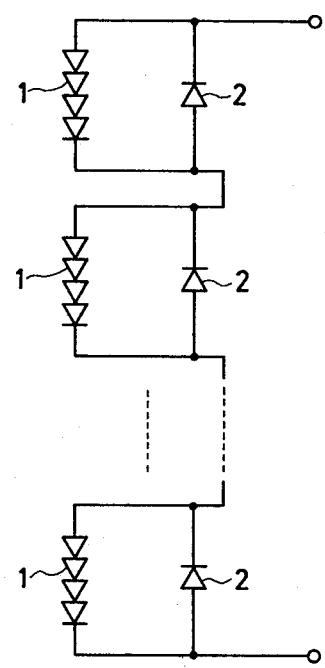
Figure 3A:
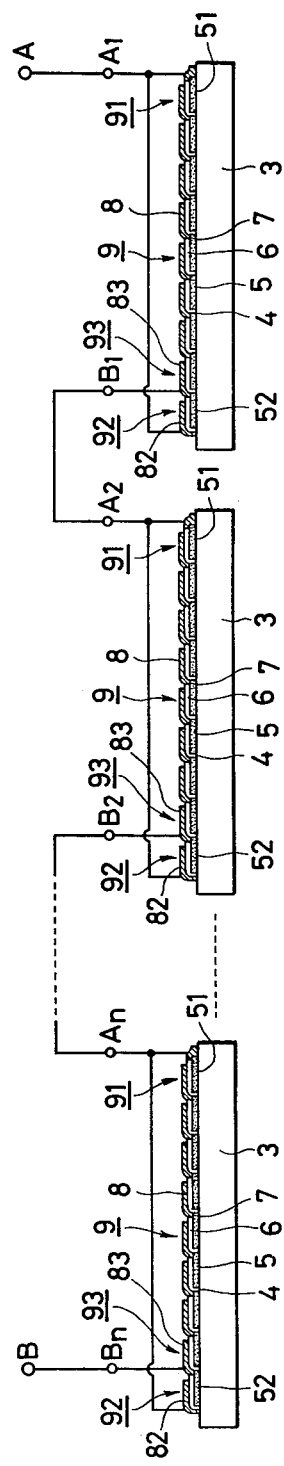
FIG. 3a is a cross-sectional view showing a series connection of the FIG. 3 device.

On the other hand, since the junction acting as the photoelectric conversion region in the solar cells is at the same time provided with a rectifying function, the solar cell 92 serves as a shunt diode, and the same arrangement as the connection shown in FIG. 2 is obtained. Accordingly, if the number of individual cells 9 (the number is 8 in the case of FIGS. 3 and 4) to be connected in series is defined in such a manner that each of the cells 9 can endure the reverse bias generated by the electromotive force of the residual cells 9 when that one of the cells 9 is shaded, the shaded cell will not be destroyed since the reverse bias added to the series of the cells 9 by other units is by-passed by the cell 92 when a plurality of such cell device units are connected in series to provide a solar cell module or array as shown in FIG. 3a. FIG. 4a is the equivalent circuit of FIG. 3a.

If the amorphous silicon film 6 in FIG. 3 is composed of an n-type layer, an intrinsic layer, and a p-type layer deposited successively on the substrate 3 in this order, a connection corresponding to the equivalent circuit shown in FIG. 5 can be obtained. FIG. 5a shows a series connection of a plurality of devices shown in FIG. 5.

Since the cell 92 can function as a solar cell, electromotive force is generated if light is applied thereto, and the polarity thereof is reversed with respect to the cells connected in series. Therefore, it is desirable to shield the cell 92. However, only a slight difference in the open voltage arises from this in practice, and the optimun operation voltage is almost not affected. Consequently, the shield is not always required.

Instead of the single cell 92 functioning as a shunt diode, a plurality of cells connected in series may be used. In this case, the terminal B position is shifted by a suitable number of cells. Consequently, the reverse bias voltage tolerated by the shunt diodes will be improved, and the number of unit solar cells connected in series for photoelectric conversion can be increased accordingly.

Another embodiment of the present invention will now be described with respect to FIG. 6, wherein a transparent conductive film 13 made of ITO is formed with small spaces 12 therein on a glass plate 11 serving as the substrate, by means of sputtering techniques. In this case, a space 12 is not provided at one end between two adjacent transparent conductive films, and thus a transparent conductive film 31 whose size is twice the normal size is formed. An amorphous silicon film 14, which fills the spaces 12 and covers the transparent conductive film 13, is provided on the substrate with small spaces 15 therein, by means of a plasma CVD technique as described above. Only the end cells silicon film 41, which is spaced apart from the amorphous silicon film 14 deposited on the transparent conductive film 31, extends to the outside of the transparent conductive film 31 so as to cover the edge thereof.

A metal film 16 such as a deposited film of aluminum, which fills the spaces 15 and covers the silicon film 14 therewith, is provided, with spaces 17. In this case, the space 15 in the silicon film 41 is not filled by the metal film 16, and one end of the metal film 61 deposited on the silicon film 41 covers the outside of the silicon film 41 and extends to the substrate. The amorphous silicon films 14 and 41 are composed of three layers as described above.

When light is applied to the silicon film through the substrate 11 and the transparent conductive film, the photoelectric conversion of the solar cell can be accomplished by the p-intrinsic layer-n junction. The respective solar cells are connected in series by the structure shown in FIG. 6.

Figure 7:
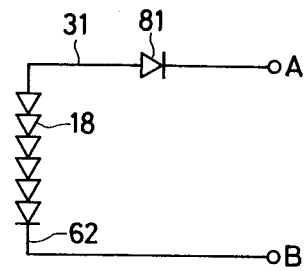
FIG. 7 is an equivalent circuit of the FIG. 6 embodiment.

In this case, the cell 81 is connected in series with the other cells 18 such that its polarity is reversed. Therefore, when one end of the metal film 61 is connected to a terminal A and the other end of the metal film 62 is connected to a terminal B, a connection corresponding to the equivalent circuit shown in FIG. 7 is obtained. The junction acting as the photoelectric conversion region of the solar cells is provided with a rectifying function at the same time. Therefore, the solar cell 81 serves as a diode to prevent a reverse current from flowing through the series circuit of the solar cells 18.

Since the cell 81 can function as a solar cell, electromotive force of reverse polarity is generated with respect to the other cells 18 if light is applied thereto, and the output voltage is reduced by this counter electromotive force. Consequently, it is desirable to shield the cell 81 (diode).

Figure 8:
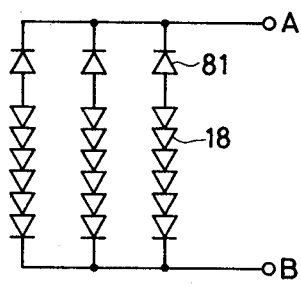
FIG. 8 is a circuit diagram of an application of the invention.

When the solar cells with the diode 81 for preventing the flow of reverse current are connected in parallel as shown in FIG. 8, circulating current flow is prevented even if an imbalance exits among the solar cells or if there is a deterioration of a cell or cells. Consequently, the lowering of cell output can be suppressed to the minumum value.

A further embodiment of the present invention will now be described with respect to FIGS. 9 and 10.

Figure 6:
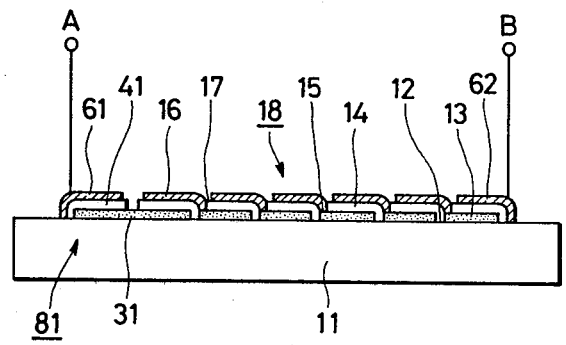
FIG. 6 is a cross-sectional view of another embodiment of the invention.
Figure 9:
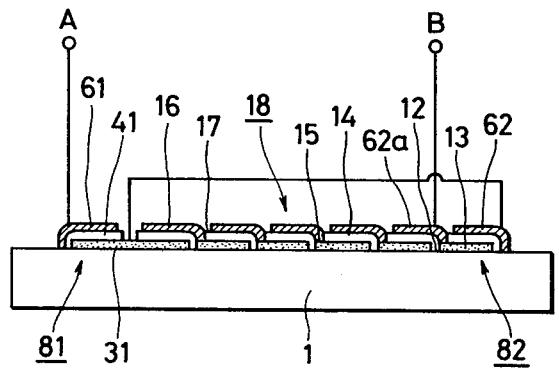
FIG. 9 is a cross-sectional view of a further embodiment of the invention.
Figure 10:
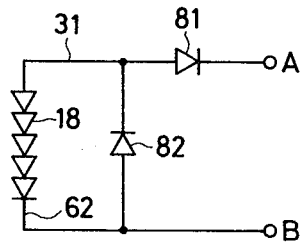
FIG. 10 is the equivalent circuit of the FIG. 9 device.

In FIG. 9, the two embodiments as shown in FIGS. 3 and 6 are combined. In this case, the layer formation is the same as shown in FIG. 6. However, one end of the metal film 62 of the end cell 82 is not connected to the terminal B but to the transparent conductive film 31. The metal film 62a of the cell 18 adjacent to the end cell 82 is connected to the terminal B. So, the equivalent cirucit shown in FIG. 10 corresponding to FIG. 9 is obtained. In this case, two solar cells 81 and 82 respectively serve as diodes in series and parallel relation to the series connected cells 18. As a result, the cell 82 serves as a diode preventing the reverse bias from being applied to the shaded cell and the cell 81 serves as a diode to prevent the reverse circulating current from flowing through the series circuit of the solar cells 18. That is, a synergistic effect by the above two diodes can be obtained at the same time.

Figure 11:
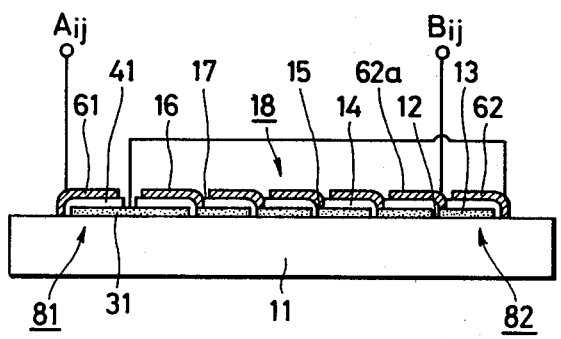
FIGS. 11 and 12 are cross-sectional views of yet further embodiments.
Figure 11A:
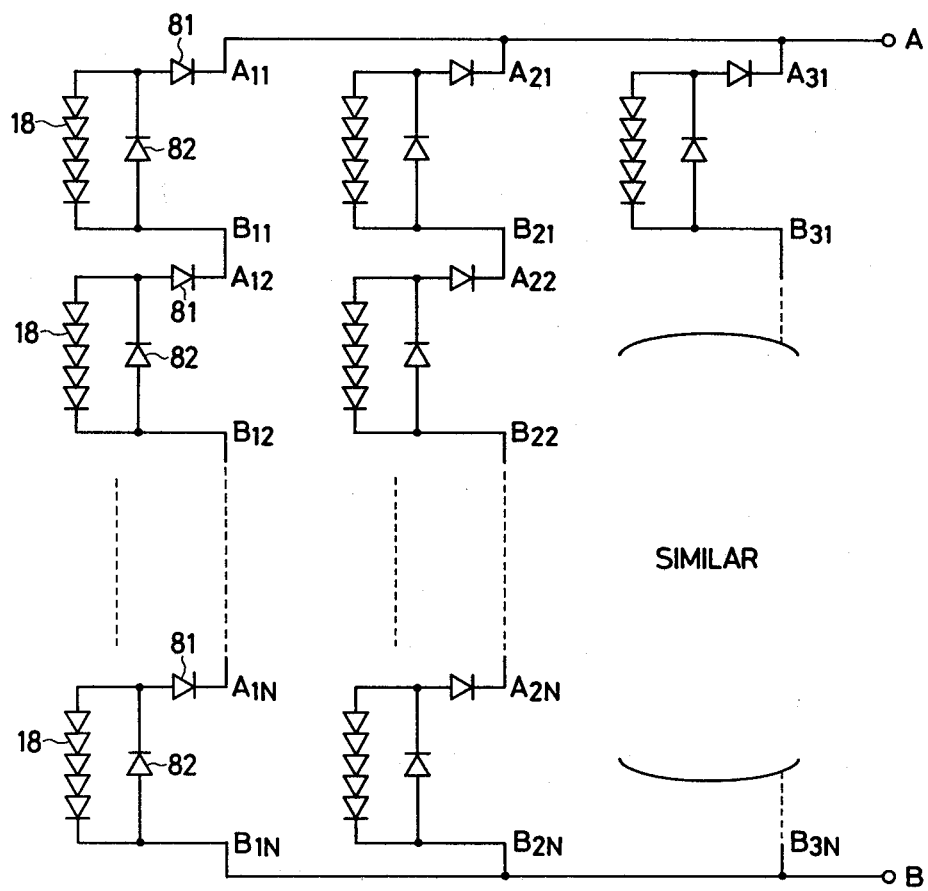
FIGS. 11a and 12a are the equivalent circuits of FIGS. 11 and 12 devices.

Furthermore, FIG. 11 shows a matrix arrangement of the embodiment of FIG. 9, that is, FIG. 9 devices are in parallel and series connected relation to each other. Suffixes i and j of the terminals A and B in FIG. 11 refer to integers i.e., 1, 2, 3, ....N. In FIG. 11a, an equivalent circuit corresponding to FIG. 11 is shown.

Figure 12:
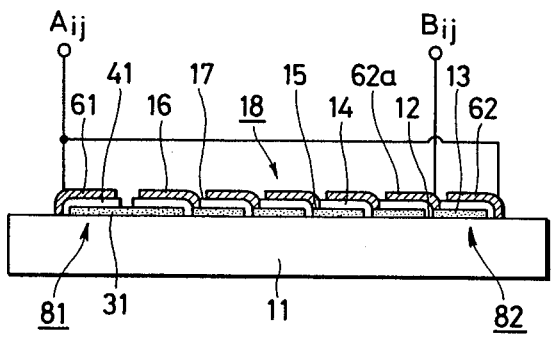
Figure 12A:
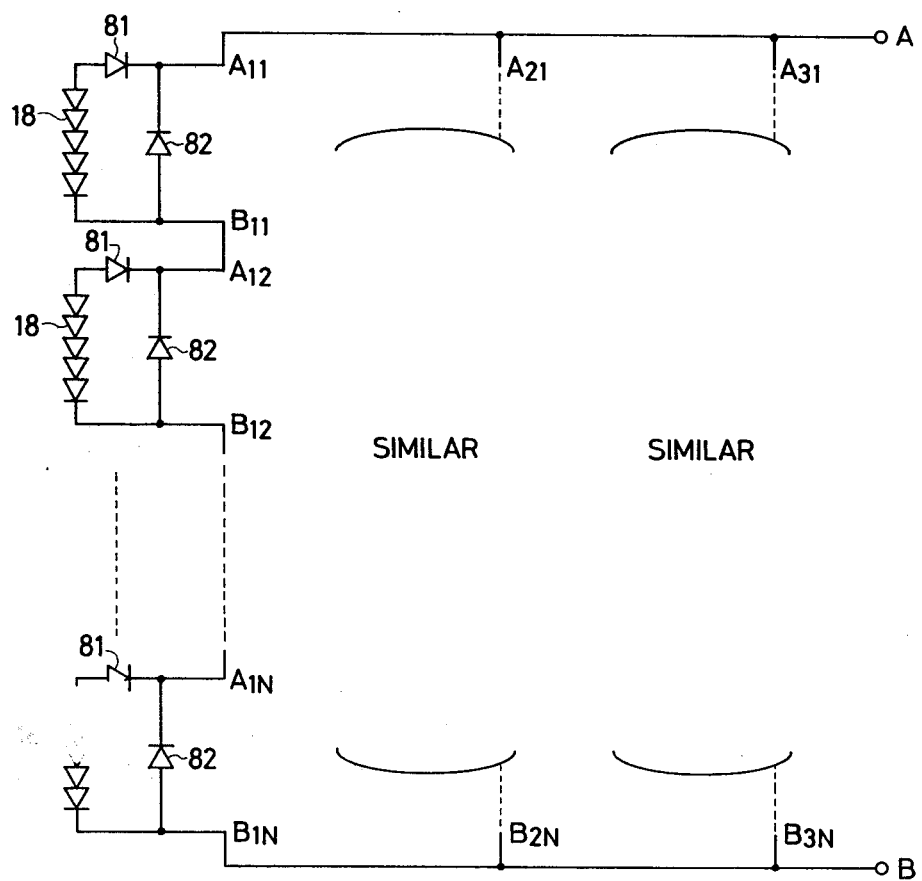

Yet a further embodiment is shown in FIG. 12. In this case, one end of the metal film 62 of the end cell 82 is not connected to the transparent conductive film 31 as in the embodiment of FIG. 11 but rather is connected to the terminal $A_{ij}$. As a result, the diodes 81 and 82 are opposite to each other. FIG. 12a shows the equivalent circuit corresponding to FIG. 12.

In FIGS. 3 and 6, by using the glass plate as the substrate, the light is transmitted through the glass plate and the transparent conductive film and is applied to the silicon thin film. However, by using a metal plate such as a stainless steel plate as the substrate and as an electrode and utilizing a transparent conductive film as the opposite electrode, the light may be applied to the silicon thin film through the transparent conductive film from the opposite side of the substrate.

Solar cells using amorphous silicon have been described in the above embodiments. However, solar cells using a polycrystalline silicon thin film deposited on the substrate can be provided instead of the amorphous silicon cells. In addition, a Schottky barrier may be formed on the silicon thin film instead of the p-i-n or pn junction, and the rectifying property thereof may be employed.

As described above, the solar cell device according to the present invention utilizes one or more solar cells directly as diode diode reversely connected in parallel or series for preventing reverse bias or reverse current. Therefore, since the diode can be produced on the same substrate with the solar cells and at the same time, excessive cost and processing is avoided, and the solar cell device can be economically manufactured. The size of the device will not be increased. The influence of an imbalance among solar cells connected in parallel will be controllable, and the solar cell device can be effectively used with high reliability.

What is claimed is:

1. A solar cell device, comprising; a plurality of solar cells each being composed of a first conductive film, a semiconductor film including a junction therein, and a second conductive film, said solar cells being arranged on a substrate at desired intervals, said first conductive film contacting said substrate, said solar cells all being connected in series by connecting said first conductive film of one cell to said second conductive film of an adjacent cell in turn, said first conductive film of a first of said series of cells and said second conductive film of a last of said series of cells being connected to one output terminal of said device, and said first conductive film of a selected cell being electrically connected to another output terminal of said device.

2. A device as claimed in claim 1, said substrate and said first conductive film being made of a light transmitting material.

3. A device as claimed in claim 1, said second conductive film being made of a light transmitting material.

4. A device as claimed in claim 1, said selected cell being arranged physically in series and electrically in parallel with ones of remaining cells.

5. A device as claimed in claim 1, said selected cell being arranged a selected number of cells from said first or last serial cells.

6. A device as claimed in claim 5, said selected cell and said selected number of cells being physically serially connected and in parallel with remaining cells of said series of cells.

7. A device as claimed in claims 1 or 6, and means for shading said selected cell or number of cells to prevent a photoelectric conversion function thereof.

8. A device as claimed in claim 7, said selected cell or number of cells constituting a parallel connected reverse polarity diode or diodes.

9. A device as claimed in claim 1, wherein said first conductive film of said first of said series of cells and said second conductive film of said last of said series of cells are connected to said one output terminal through at least one further cell, said at least one further cell comprising at least one further first conductive film, at least one further semiconductor film including a junction, and at least one further second conductive film, said at least one further first conductive film contacting said substrate and comprising a common first conductive film shared by said first of said series of cells, said at least one further second conductive film being connected to said one output terminal of said device.

10. A multi-cell solar cell apparatus comprising a first series of solar cell devices of the type defined in claim 9, each said solar cell device including said one and said another output terminals, said solar cell devices in said first series being coupled in series with one another with said one output terminal of one of said devices being coupled to said another output terminal of an adjacent one of said devices in turn, said one output terminal of a first of said series of devices being coupled to an output terminal of said multi-cell apparatus and said another output terminal of a last of said devices in said first series being coupled to another output terminal of said multi-cell apparatus.

11. A multi-cell solar cell apparatus as defined in claim 10, further comprising a plurality of said series connections coupled in parallel with one another.

12. A solar cell device, comprising: a plurality of solar cells each being composed of a first conductive film, a semiconductor film including a junction therein, and a second conductive film, said solar cells being arranged on a substrate at desired intervals, said first conductive film contacting said substrate, said solar cells being connected in series by connecting said first conductive film of one cell to said second conductive film of an adjacent cell in turn, said device including at least one further cell comprising at least one further first conductive film, at least one further semiconductor film including a junction, and at least one further second conductive film, said at least one further first conductive film contacting said substrate and comprising a common first conductive film shared by a last of said series of cells, said second conductive film of a first of said series of cells and second conductive film of said at least one further cell being coupled together and to one output terminal of said device, and said first conductive film of a selected cell being connected to another output terminal of said device.

13. A multi-cell solar cell apparatus comprising a plurality of solar cell devices of the type defined in claim 12, each of said plurality of solar cell devices including said one and said another output terminals, said devices being coupled in series with one another with said one output terminal of one of said devices being coupled to said another output terminal of an adjacent device in turn, said one output terminal of a first of said devices being coupled to one output terminal of said multi-cell apparatus, and said another output terminal of a last of said devices being coupled to another output terminal of said multi-cell apparatus.

14. A multi-cell solar cell apparatus as defined in claim 13, further comprising at least one additional series connecting of solar cell devices connected in parallel with said first series.

* * * * *